United States Patent
Kato et al.

(10) Patent No.: US 12,495,705 B2
(45) Date of Patent: Dec. 9, 2025

(54) DISPLAY DEVICE AND MANUFACTURING METHOD OF DISPLAY DEVICE

(71) Applicant: Magnolia White Corporation, Tokyo (JP)

(72) Inventors: Daisuke Kato, Tokyo (JP); Hiraaki Kokame, Tokyo (JP); Noriyuki Hirata, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 284 days.

(21) Appl. No.: 18/340,041

(22) Filed: Jun. 23, 2023

(65) Prior Publication Data

US 2023/0422583 A1    Dec. 28, 2023

(30) Foreign Application Priority Data

Jun. 28, 2022  (JP) .............................. 2022-103681

(51) Int. Cl.
*H10K 59/80* (2023.01)
*H10K 59/12* (2023.01)
*H10K 59/121* (2023.01)
*H10K 59/122* (2023.01)

(52) U.S. Cl.
CPC ..... *H10K 59/8731* (2023.02); *H10K 59/1201* (2023.02)

(58) Field of Classification Search
CPC ............... H10K 59/122; H10K 59/873; H10K 59/8731; H10K 15/1201; H10K 59/121
See application file for complete search history.

(56) References Cited

U.S. PATENT DOCUMENTS

| | | |
|---|---|---|
| 2002/0140041 A1 | 10/2002 | Endoh |
| 2004/0160170 A1 | 8/2004 | Sato et al. |
| 2009/0009069 A1 | 1/2009 | Takata |
| 2009/0309486 A1 | 12/2009 | Imai et al. |
| 2017/0244066 A1 | 8/2017 | Kamiya et al. |
| 2019/0363275 A1 | 11/2019 | Ochi et al. |
| 2022/0077251 A1 | 3/2022 | Choung et al. |
| 2022/0140008 A1* | 5/2022 | Fukagawa ............ H10K 59/122 257/98 |

FOREIGN PATENT DOCUMENTS

| | | |
|---|---|---|
| JP | 2000-195677 A | 7/2000 |
| JP | 2002-299604 A | 10/2002 |
| JP | 2004-207217 A | 7/2004 |

(Continued)

*Primary Examiner* — Joseph L Williams
(74) *Attorney, Agent, or Firm* — XSENSUS LLP

(57) ABSTRACT

According to one embodiment, a manufacturing method of a display device includes preparing a processing substrate by forming a lower electrode, forming a rib, and forming a partition, forming an organic layer on the lower electrode, forming an upper electrode on the organic layer, forming a cap layer on the upper electrode, forming a sealing layer on the cap layer, forming a patterned resist on the sealing layer, and removing the sealing layer exposed from the resist by dry etching. The sealing layer includes a first high-density layer and a low-density layer. When dry etching is applied to the sealing layer, an etching rate of the low-density layer is greater than an etching rate of the first high-density layer.

17 Claims, 16 Drawing Sheets

(56) References Cited

FOREIGN PATENT DOCUMENTS

| | | | |
|---|---|---|---|
| JP | 2005-222778 | A | 8/2005 |
| JP | 2006-338947 | A | 12/2006 |
| JP | 2007-184251 | A | 7/2007 |
| JP | 2008-135325 | A | 6/2008 |
| JP | 2009-32673 | A | 2/2009 |
| JP | 2010-118191 | A | 5/2010 |
| JP | 2017-147191 | A | 8/2017 |
| WO | 2018/179308 | A1 | 10/2018 |

* cited by examiner

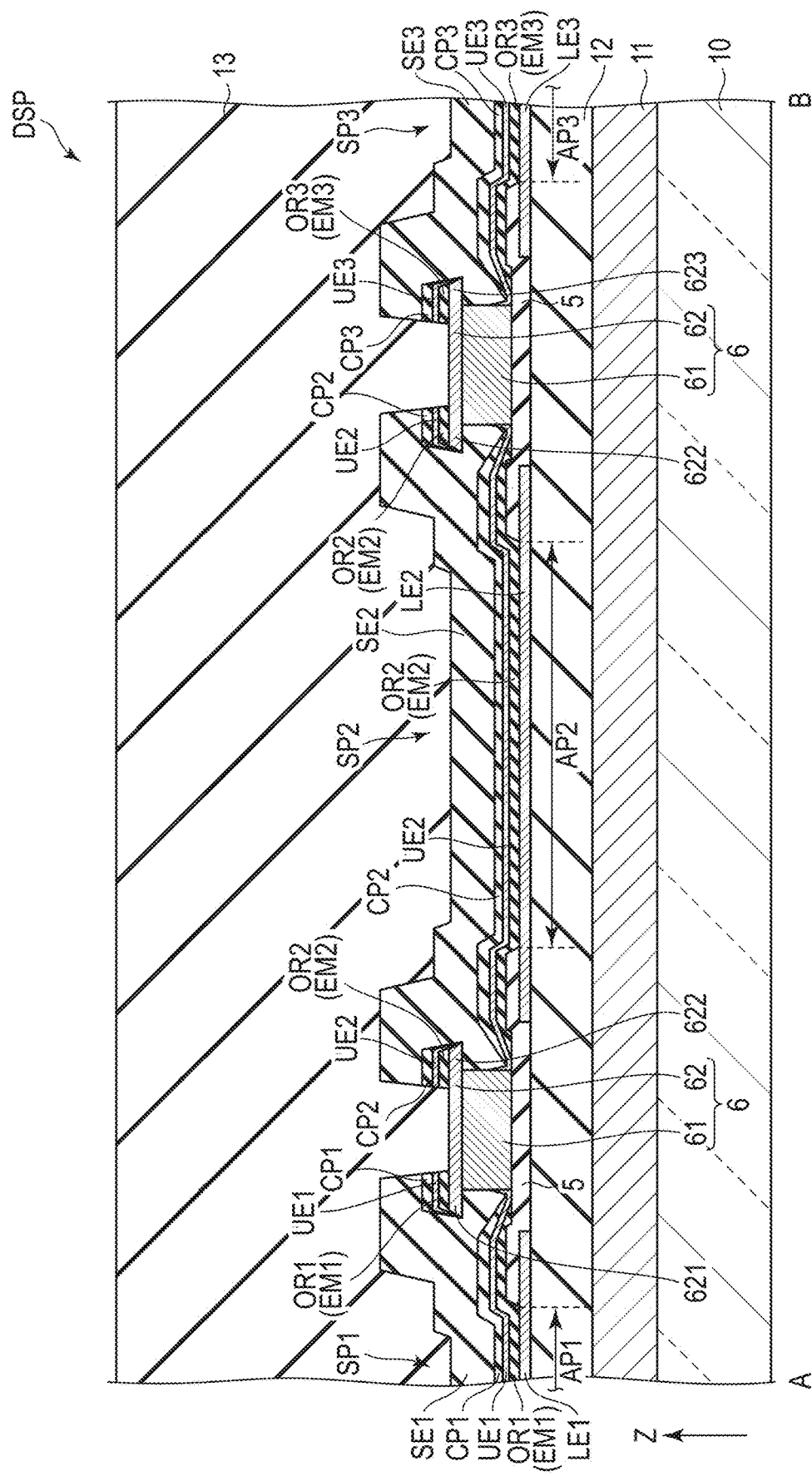
F I G. 3

DISPLAY DEVICE AND MANUFACTURING METHOD OF DISPLAY DEVICE

CROSS-REFERENCE TO RELATED APPLICATIONS

This application is based upon and claims the benefit of priority from Japanese Patent Application No. 2022-103681, filed Jun. 28, 2022, the entire contents of which are incorporated herein by reference.

FIELD

Embodiments described herein relate generally to a display device and a manufacturing method of a display device.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole transport layer and an electron transport layer in addition to a light emitting layer.

In the process of manufacturing such a display element, a technique which prevents the reduction in reliability has been required.

BRIEF DESCRIPTION OF THE DRAWINGS

FIG. 3 is a schematic cross-sectional view of the display device DSP along the A-B line of FIG. 2.

DETAILED DESCRIPTION

Figure 1:
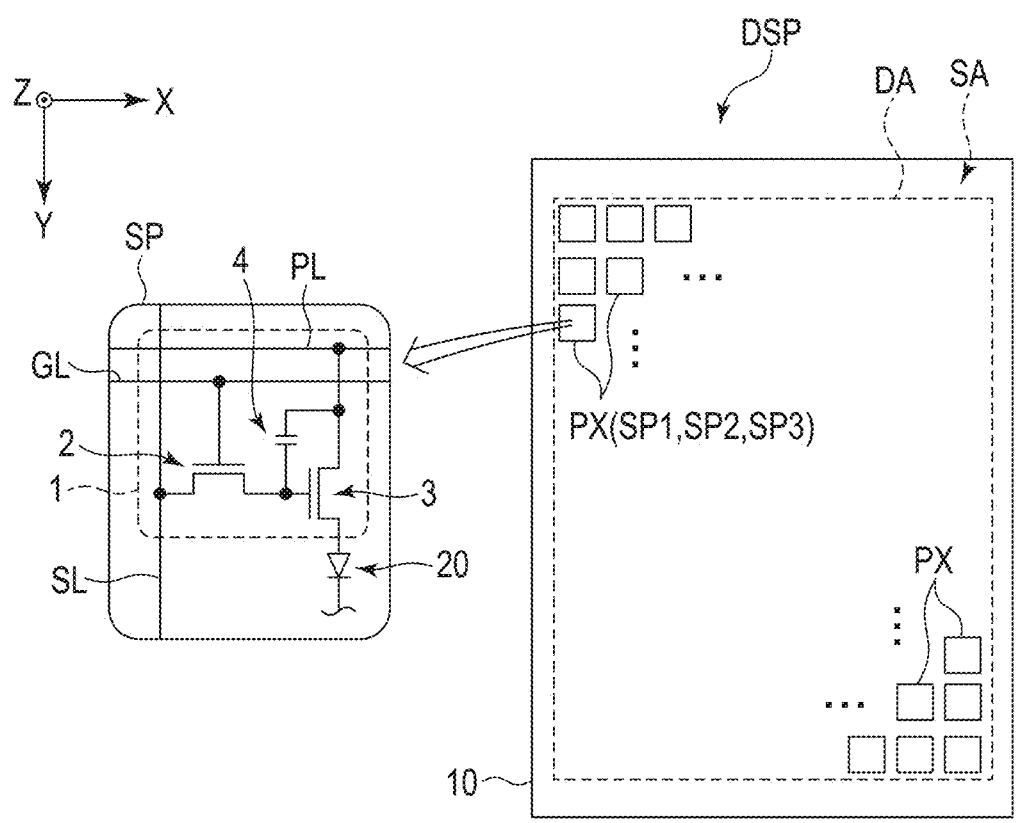
FIG. 1 is a diagram showing a configuration example of a display device DSP.

Embodiments described herein aim to provide a display device which can prevent the reduction in reliability and a manufacturing method of such a display device.

In general, according to one embodiment, a manufacturing method of a display device comprises preparing a processing substrate by forming a lower electrode above a substrate, forming a rib comprising an aperture overlapping the lower electrode, and forming a partition including a lower portion located on the rib and an upper portion located on the lower portion and protruding from a side surface of the lower portion, forming an organic layer on the lower electrode in the aperture, forming an upper electrode on the organic layer, forming a cap layer on the upper electrode, forming a sealing layer on the cap layer, forming a patterned resist on the sealing layer, and removing the sealing layer exposed from the resist by dry etching. The sealing layer includes a first high-density layer formed of an inorganic insulating material, and a low-density layer which is stacked on the first high-density layer, has a density lower than the first high-density layer, and is formed of an inorganic insulating material. When dry etching is applied to the sealing layer, an etching rate of the low-density layer is greater than an etching rate of the first high-density layer.

According to another embodiment, a display device comprises a substrate, a lower electrode provided above the substrate, a rib formed of an inorganic insulating material and comprising an aperture overlapping the lower electrode, a partition comprising a lower portion provided on the rib and formed of a conductive material, and an upper portion provided on the lower portion and protruding from a side surface of the lower portion, an organic layer provided on the lower electrode in the aperture, an upper electrode which is provided on the organic layer and is in contact with the lower portion of the partition, a cap layer provided on the upper electrode, and a sealing layer which covers the cap layer and is in contact with the lower portion of the partition. The sealing layer includes a first high-density layer formed of an inorganic insulating material, and a low-density layer which is stacked on the first high-density layer, has a density lower than the first high-density layer, and is formed of an inorganic insulating material.

The embodiments can provide a display device which can prevent the reduction in reliability and a manufacturing method of such a display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. When various elements are viewed parallel to the third direction Z, the appearance is defined as a plan view.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element.

Figure 2:
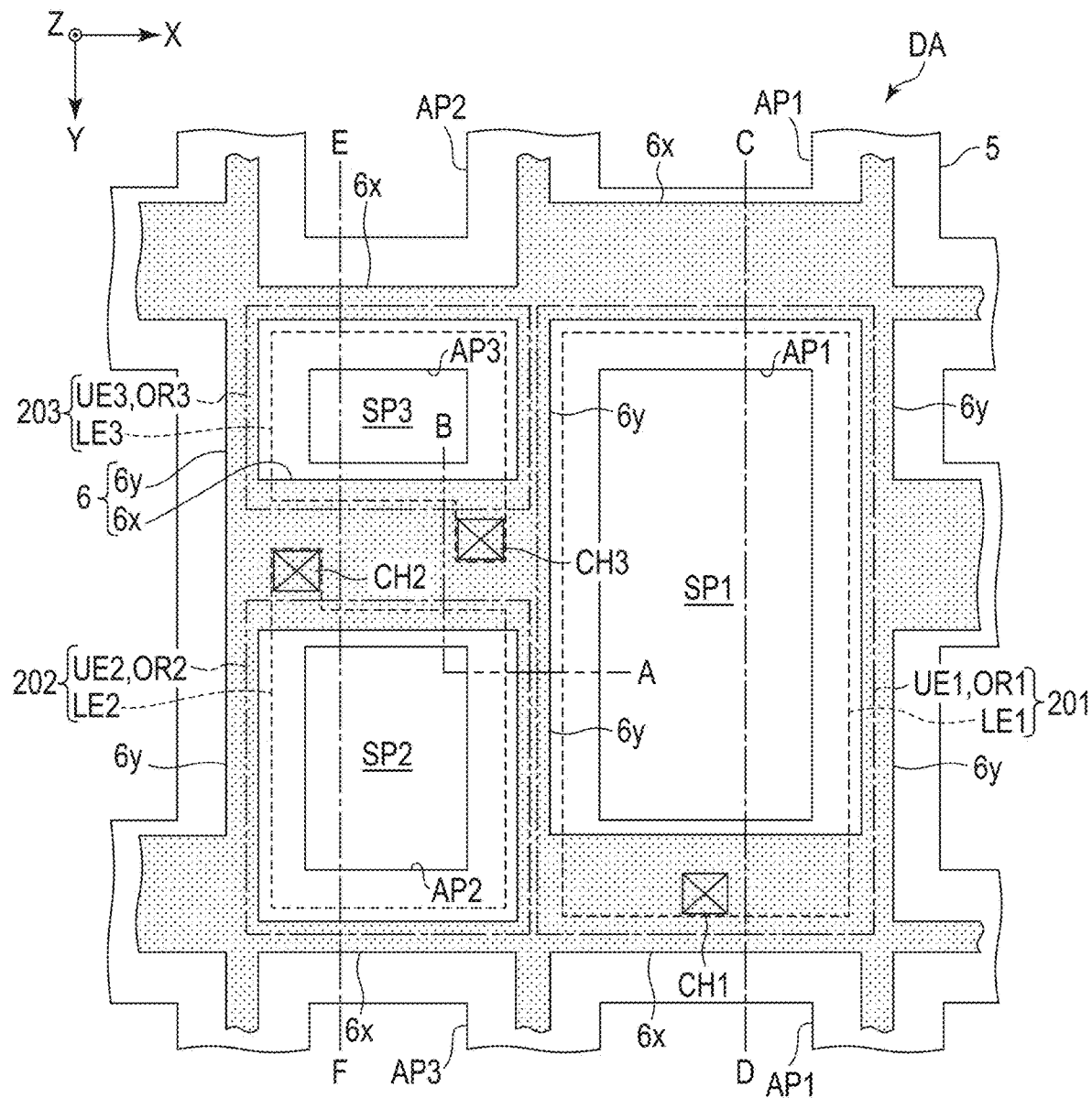
FIG. 2 is a diagram showing an example of the layout of subpixels SP1, SP2 and SP3.

FIG. 2 is a diagram showing an example of the layout of subpixels SP1, SP2 and SP3.

In the example of FIG. 2, subpixels SP2 and SP3 are arranged in the second direction Y. Further, each of subpixels SP2 and SP3 is adjacent to subpixel SP1 in the first direction X.

When subpixels SP1, SP2 and SP3 are provided in line with this layout, in the display area DA, a column in which subpixels SP2 and SP3 are alternately provided in the second direction Y and a column in which a plurality of subpixels SP1 are provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively.

The partition 6 overlaps the rib 5 as seen in plan view. The partition 6 comprises a plurality of first partitions 6x extending in the first direction X and a plurality of second partitions 6y extending in the second direction Y. The first partitions 6x are provided between the apertures AP2 and AP3 which are adjacent to each other in the second direction Y and between two apertures AP1 which are adjacent to each other in the second direction Y. Each second partition 6y is provided between the apertures AP1 and AP2 which are adjacent to each other in the first direction X and between the apertures AP1 and AP3 which are adjacent to each other in the first direction X.

In the example of FIG. 2, the first partitions 6x and the second partitions 6y are connected to each other. Thus, the partition 6 is formed into a grating shape surrounding the apertures AP1, AP2 and AP3 as a whole. In other words, the partition 6 comprises apertures in subpixels SP1, SP2 and SP3 in a manner similar to that of the rib 5.

Subpixels SP1, SP2 and SP3 comprise display elements 201, 202 and 203, respectively, as the display elements 20.

Subpixel SP1 comprises a lower electrode LE1, an upper electrode UE1 and an organic layer OR1 overlapping the aperture AP1. Subpixel SP2 comprises a lower electrode LE2, an upper electrode UE2 and an organic layer OR2 overlapping the aperture AP2. Subpixel SP3 comprises a lower electrode LE3, an upper electrode UE3 and an organic layer OR3 overlapping the aperture AP3.

In the example of FIG. 2, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. The peripheral portion of each of the lower electrodes LE1, LE2 and LE3 overlaps the rib 5. It should be noted that the outer shape of each of the lower electrodes, organic layers and upper electrodes shown in the figure does not necessarily reflect the accurate shape.

The lower electrode LE1, the upper electrode UE1 and the organic layer OR1 constitute the display element 201 of subpixel SP1. The lower electrode LE2, the upper electrode UE2 and the organic layer OR2 constitute the display element 202 of subpixel SP2. The lower electrode LE3, the upper electrode UE3 and the organic layer OR3 constitute the display element 203 of subpixel SP3.

The lower electrodes LE1, LE2 and LE3 correspond to, for example, the anodes of the display elements. The upper electrodes UE1, UE2 and UE3 correspond to the cathodes of the display elements or a common electrode.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the area of the aperture AP1 is greater than that of the aperture AP2, and the area of the aperture AP2 is greater than that of the aperture AP3. In other words, the area of the lower electrode LE1 exposed from the aperture AP1 is greater than that of the lower electrode LE2 exposed from the aperture AP2. The area of the lower electrode LE2 exposed from the aperture AP2 is greater than that of the lower electrode LE3 exposed from the aperture AP3.

For example, the display element 201 of subpixel SP1 is configured to emit light in a blue wavelength range. The display element 202 of subpixel SP2 is configured to emit light in a green wavelength range. The display element 203 of subpixel SP3 is configured to emit light in a red wavelength range.

FIG. 3 is a schematic cross-sectional view of the display device DSP along the A-B line of FIG. 2.

A circuit layer 11 is provided on the substrate 10 described above. The circuit layer 11 includes various circuits such as the pixel circuit 1 shown in FIG. 1 and various lines such as the scanning line GL, the signal line SL and the power line PL. The circuit layer 11 is covered with an insulating layer 12. The insulating layer 12 functions as a planarization film which planarizes the irregularities formed by the circuit layer 11.

The lower electrodes LE1, LE2 and LE3 are provided on the insulating layer 12. The rib 5 is provided on the insulating layer 12 and the lower electrodes LE1, LE2 and LE3. The end portions of the lower electrodes LE1, LE2 and LE3 are covered with the rib 5. In other words, the end portions of the lower electrodes LE1, LE2 and LE3 are provided between the insulating layer 12 and the rib 5. Of the lower electrodes LE1, LE2 and LE3, between the lower electrodes which are adjacent to each other, the insulating layer 12 is covered with the rib 5.

The partition 6 includes a lower portion (stem) 61 provided on the rib 5 and an upper portion (shade) 62 provided on the lower portion 61. The lower portion 61 of the partition 6 shown on the left side of the figure is located between the aperture AP1 and the aperture AP2. The lower portion 61 of the partition 6 shown on the right side of the figure is located between the aperture AP2 and the aperture AP3. The upper portion 62 has a width greater than that of the lower portion 61. By this configuration, the both end portions of the upper portion 62 protrude relative to the side surfaces of the lower portion 61. This shape of the partition 6 may be called an overhang shape. Of the upper portion 62, a portion which protrudes to the aperture AP1 relative to the lower portion 61 is referred to as a protrusion 621. A portion which protrudes to the aperture AP2 relative to the lower portion 61 is referred to as a protrusion 622. A portion which protrudes to the aperture AP3 relative to the lower portion 61 is referred to as a protrusion 623.

The organic layer OR1 is in contact with the lower electrode LE1 through the aperture AP1, covers the lower electrode LE1 and overlaps part of the rib 5. The upper electrode UE1 faces the lower electrode LE1 and is provided on the organic layer OR1. Further, the upper electrode UE1 is in contact with a side surface of the lower portion 61. The organic layer OR1 and the upper electrode UE1 are located on the lower side relative to the upper portion 62.

The organic layer OR2 is in contact with the lower electrode LE2 through the aperture AP2, covers the lower electrode LE2 and overlaps part of the rib 5. The upper electrode UE2 faces the lower electrode LE2 and is provided on the organic layer OR2. Further, the upper electrode UE2 is in contact with a side surface of the lower portion 61. The organic layer OR2 and the upper electrode UE2 are located on the lower side relative to the upper portion 62.

The organic layer OR3 is in contact with the lower electrode LE3 through the aperture AP3, covers the lower electrode LE3 and overlaps part of the rib 5. The upper electrode UE3 faces the lower electrode LE3 and is provided on the organic layer OR3. Further, the upper electrode UE3 is in contact with a side surface of the lower portion 61. The organic layer OR3 and the upper electrode UE3 are located on the lower side relative to the upper portion 62.

Subpixels SP1, SP2 and SP3 further include cap layers (optical adjustment layers) CP1, CP2 and CP3 for adjusting the optical property of the light emitted from the light emitting layers of the organic layers OR1, OR2 and OR3.

The cap layer CP1 is located in the aperture AP1, is located on the lower side relative to the upper portion 62 and is provided on the upper electrode UE1. The cap layer CP2 is located in the aperture AP2, is located on the lower side relative to the upper portion 62 and is provided on the upper electrode UE2. The cap layer CP3 is located in the aperture AP3, is located on the lower side relative to the upper portion 62 and is provided on the upper electrode UE3.

Sealing layers SE1, SE2 and SE3 are provided in subpixels SP1, SP2 and SP3, respectively.

The sealing layer SE1 is in contact with the cap layer CP1 and the lower and upper portions 61 and 62 of the partition 6 and continuously covers the members of subpixel SP1. The sealing layer SE1 does not include a void immediately under the protrusion 621.

The sealing layer SE2 is in contact with the cap layer CP2 and the lower and upper portions 61 and 62 of the partition 6 and continuously covers the members of subpixel SP2. The sealing layer SE2 does not include a void immediately under the protrusion 622.

The sealing layer SE3 is in contact with the cap layer CP3 and the lower and upper portions 61 and 62 of the partition 6 and continuously covers the members of subpixel SP3. The sealing layer SE3 does not include a void immediately under the protrusion 623.

The sealing layers SE1, SE2 and SE3 are covered with a protective layer 13.

In the example shown in the figure, part of the organic layer OR1, part of the upper electrode UE1 and part of the cap layer CP1 are located between the partition 6 and the sealing layer SE1, are provided on the upper portion 62, are provided such that the upper portion 62 is partly exposed, and are spaced apart from the portions located on the lower side relative to the upper portion 62.

Further, part of the organic layer OR2, part of the upper electrode UE2 and part of the cap layer CP2 are located between the partition 6 and the sealing layer SE2, are provided on the upper portion 62, are provided such that the upper portion 62 is partly exposed, and are spaced apart from the portions located on the lower side relative to the upper portion 62.

Further, part of the organic layer OR3, part of the upper electrode UE3 and part of the cap layer CP3 are located between the partition 6 and the sealing layer SE3, are provided on the upper portion 62, are provided such that the upper portion 62 is partly exposed, and are spaced apart from the portions located on the lower side relative to the upper portion 62.

Immediately above the partition 6 between subpixels SP1 and SP2, the organic layer OR1 is spaced apart from the organic layer OR2, and the upper electrode UE1 is spaced apart from the upper electrode UE2, and the cap layer CP1 is spaced apart from the cap layer CP2, and the sealing layer SE1 is spaced apart from the sealing layer SE2. The protective layer 13 is provided between the organic layer OR1 and the organic layer OR2, between the upper electrode UE1 and the upper electrode UE2, between the cap layer CP1 and the cap layer CP2 and between the sealing layer SE1 and the sealing layer SE2, and is in contact with the upper portion 62.

Immediately above the partition 6 between subpixels SP2 and SP3, the organic layer OR2 is spaced apart from the organic layer OR3, and the upper electrode UE2 is spaced apart from the upper electrode UE3, and the cap layer CP2 is spaced apart from the cap layer CP3, and the sealing layer SE2 is spaced apart from the sealing layer SE3. The protective layer 13 is provided between the organic layer OR2 and the organic layer OR3, between the upper electrode UE2 and the upper electrode UE3, between the cap layer CP2 and the cap layer CP3 and between the sealing layer SE2 and the sealing layer SE3, and is in contact with the upper portion 62.

The insulating layer 12 is an organic insulating layer. The rib 5 and the sealing layers SE1, SE2 and SE3 are inorganic insulating layers.

The rib 5 is formed of silicon nitride (SiNx) as an example of inorganic insulating materials. It should be noted that the rib 5 may be formed as, as another inorganic insulating material, a single-layer body of one of silicon oxide (SiOx), silicon oxynitride (SiON) and aluminum oxide ($Al_2O_3$). The rib 5 may be formed as a stacked layer body of a combination consisting of at least two of a silicon nitride layer, a silicon oxide layer, a silicon oxynitride layer and an aluminum oxide layer.

The sealing layers SE1, SE2 and SE3 are formed of, for example, the same inorganic insulating material.

Each of the sealing layers SE1, SE2 and SE3 is formed of silicon nitride (SiNx) as an example of inorganic insulating materials. It should be noted that each of the sealing layers SE1, SE2 and SE3 may be formed of, as another inorganic insulating material, silicon oxide (SiOx), silicon oxynitride (SiON) or aluminum oxide ($Al_2O_3$). Each of the sealing layers SE1, SE2 and SE3 may be formed as a stacked layer body of a combination consisting of at least two of a silicon nitride layer, a silicon oxide layer, a silicon oxynitride layer and an aluminum oxide layer. Thus, the sealing layers SE1, SE2 and SE3 may be formed of the same material as the rib 5.

The lower portion 61 of the partition 6 is formed of a conductive material and is electrically connected to the upper electrodes UE1, UE2 and UE3. The upper portion 62 of the partition 6 may be also formed of a conductive material.

The thickness of the rib 5 is sufficiently less than the thicknesses of the partition 6 and the insulating layer 12. For example, the thickness of the rib 5 is greater than or equal to 200 nm but less than or equal to 400 nm.

The thickness of the lower portion 61 of the partition 6 (the thickness from the upper surface of the rib 5 to the lower surface of the upper portion 62) is greater than that of the rib 5.

The thickness of the sealing layer SE1, the thickness of the sealing layer SE2 and the thickness of the sealing layer SE3 are substantially equal to each other and are, for example, greater than or equal to 1 μm.

Each of the lower electrodes LE1, LE2 and LE3 may be formed of a transparent conductive material such as ITO or may comprise a multilayer structure of a metal material such as silver (Ag) and a transparent conductive material. Each of the upper electrodes UE1, UE2 and UE3 is formed of, for example, a metal material such as an alloy of magnesium and silver (MgAg). Each of the upper electrodes UE1, UE2 and UE3 may be formed of a transparent conductive material such as ITO.

Each of the organic layers OR1, OR2 and OR3 includes a plurality of functional layers such as a hole injection layer, a hole transport layer, an electron blocking layer, a hole blocking layer, an electron transport layer and an electron injection layer. The organic layer OR1 includes a light emitting layer EM1. The organic layer OR2 includes a light emitting layer EM2. The light emitting layer EM2 is formed of a material different from that of the light emitting layer EM1. The organic layer OR3 includes a light emitting layer EM3. The light emitting layer EM3 is formed of a material different from the materials of the light emitting layers EM1 and EM2.

The material of the light emitting layer EM1, the material of the light emitting layer EM2 and the material of the light emitting layer EM3 are materials which emit light in different wavelength ranges.

For example, the light emitting layer EM1 is formed of a material which emits light in a blue wavelength range. The light emitting layer EM2 is formed of a material which emits light in a green wavelength range. The light emitting layer EM3 is formed of a material which emits light in a red wavelength range.

Each of the cap layers CP1, CP2 and CP3 is formed of, for example, a multilayer body consisting of transparent thin films. As the thin films, the multilayer body includes a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3.

The protective layer 13 is formed of a multilayer body consisting of transparent thin films. For example, as the thin films, the multilayer body includes a thin film formed of an inorganic material and a thin film formed of an organic material.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer EM1 of the organic layer OR1 emits light in a blue wavelength range. When a potential difference is formed between the lower electrode LE2 and the upper electrode UE2, the light emitting layer EM2 of the organic layer OR2 emits light in a green wavelength range. When a potential difference is formed between the lower electrode LE3 and the upper electrode UE3, the light emitting layer EM3 of the organic layer OR3 emits light in a red wavelength range.

Figure 4:
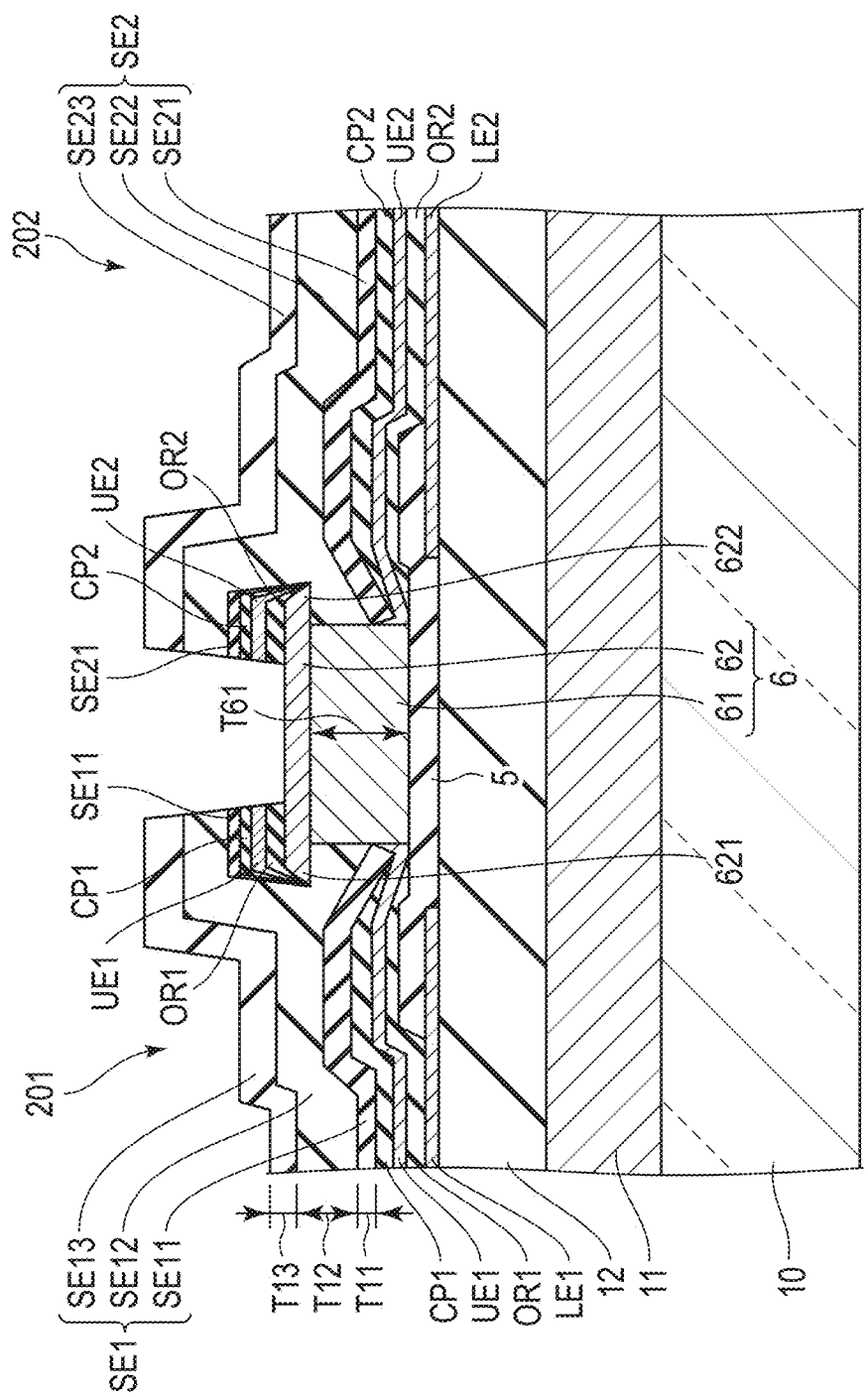
FIG. 4 is a cross-sectional view showing a configuration example of a sealing layer.

FIG. 4 is a cross-sectional view showing a configuration example of a sealing layer. Here, this specification explains a configuration example of the sealing layer SE1 with reference to a cross-sectional view in which the vicinity of the partition 6 between the display element 201 and the display element 202 is enlarged.

The sealing layer SE1 which covers the display element 201 comprises a high-density layer SE11, a low-density layer SE12 and a high-density layer SE13. The high-density layer SE11, the low-density layer SE12 and the high-density layer SE13 are stacked in this order.

The density of the high-density layer SE11 is higher than that of the low-density layer SE12. The high-density layer SE11 is formed of a transparent inorganic insulating material. The high-density layer SE11 overlaps the cap layer CP1 immediately above the lower electrode LE1. Further, the high-density layer SE11 overlaps the cap layer CP1 immediately above the partition 6. Of the high-density layer SE11, the portion provided on the upper portion 62 of the partition 6 is spaced apart from the portion located on the lower side relative to the upper portion 62. Thus, of the partition 6, at least part of the side surface of the lower portion 61 is exposed from the high-density layer SE11.

The low-density layer SE12 is formed of a transparent inorganic insulating material. The low-density layer SE12 covers the high-density layer SE11, is in contact with the side surface of the lower portion 61 of the partition 6, and fills the lower side of the protrusion 621.

The density of the high-density layer SE13 is higher than that of the low-density layer SE12. The high-density layer SE13 is formed of a transparent inorganic insulating material. The high-density layer SE13 covers the low-density layer SE12.

As described above, each of the high-density layer SE11, the low-density layer SE12 and the high-density layer SE13 is formed of silicon nitride. However, each of them may be formed of silicon oxide, silicon oxynitride or aluminum oxide.

When all of the high-density layer SE11, the low-density layer SE12 and the high-density layer SE13 are formed of silicon nitride, the low-density layer SE12 contains a large amount of other elements such as hydrogen compared to the high-density layer SE11 and the high-density layer SE13. Thus, the bond between silicon and nitrogen is suppressed, and the density is made low. Thus, in this specification, the density corresponds to the content of silicon nitride per unit volume.

The high-density layer SE11 and the high-density layer SE13 have an excellent waterproof property compared to the low-density layer SE12.

The high-density layer SE11, the low-density layer SE12 and the high-density layer SE13 are formed by, for example, a chemical vapor deposition (CVD) method. At this time, the high-density layer SE11 and the high-density layer SE13 are formed on the condition that the directivity of the deposited material is higher, compared to the low-density layer SE12. For this reason, the high-density layer SE11 is divided by the partition 6. The low-density layer SE12 is formed on the condition that the deposited material more easily wraps around, compared to the high-density layer SE11. Thus, the low-density layer SE12 fills the lower side of the protrusion 621, thereby preventing the formation of a void.

It should be noted that the high-density layer SE11, the low-density layer SE12 and the high-density layer SE13 may be formed of by, as another method, an atomic layer deposition (ALD) method.

Immediately above the lower electrode LE1, the high-density layer SE11 has thickness T11, and the low-density layer SE12 has thickness T12, and the high-density layer SE13 has thickness T13.

Thickness T12 of the low-density layer SE12 is greater than thickness T11 of the high-density layer SE11 and is greater than thickness T13 of the high-density layer SE13.

Thickness T12 of the low-density layer SE12 is greater than or equal to 0.6 times thickness T61 of the lower portion 61 of the partition 6 but less than or equal to 0.8 times thickness T61.

The sum of thickness T11 of the high-density layer SE11 and thickness T13 of the high-density layer SE13 is greater than or equal to 800 nm but less than or equal to 1000 nm.

For example, when thickness T61 of the lower portion 61 is 1 μm, thickness T11 of the high-density layer SE11 is 500 nm, and thickness T12 of the low-density layer SE12 is 800 nm, and thickness T13 of the high-density layer SE13 is 500 nm, and the total thickness of the sealing layer SE1 is 1800 nm.

In a manner similar to that of the sealing layer SE1, the sealing layer SE2 which covers the display element 202 comprises a high-density layer SE21, a low-density layer SE22 and a high-density layer SE23. The high-density layer SE21, the low-density layer SE22 and the high-density layer SE23 are stacked in this order. The sealing layer SE2 is configured in a manner similar to that of the sealing layer SE1, detailed description thereof being omitted.

In the configuration example shown in FIG. 4, the high-density layer SE11 corresponds to a first high-density layer, and the high-density layer SE13 corresponds to a second high-density layer.

Figure 5:
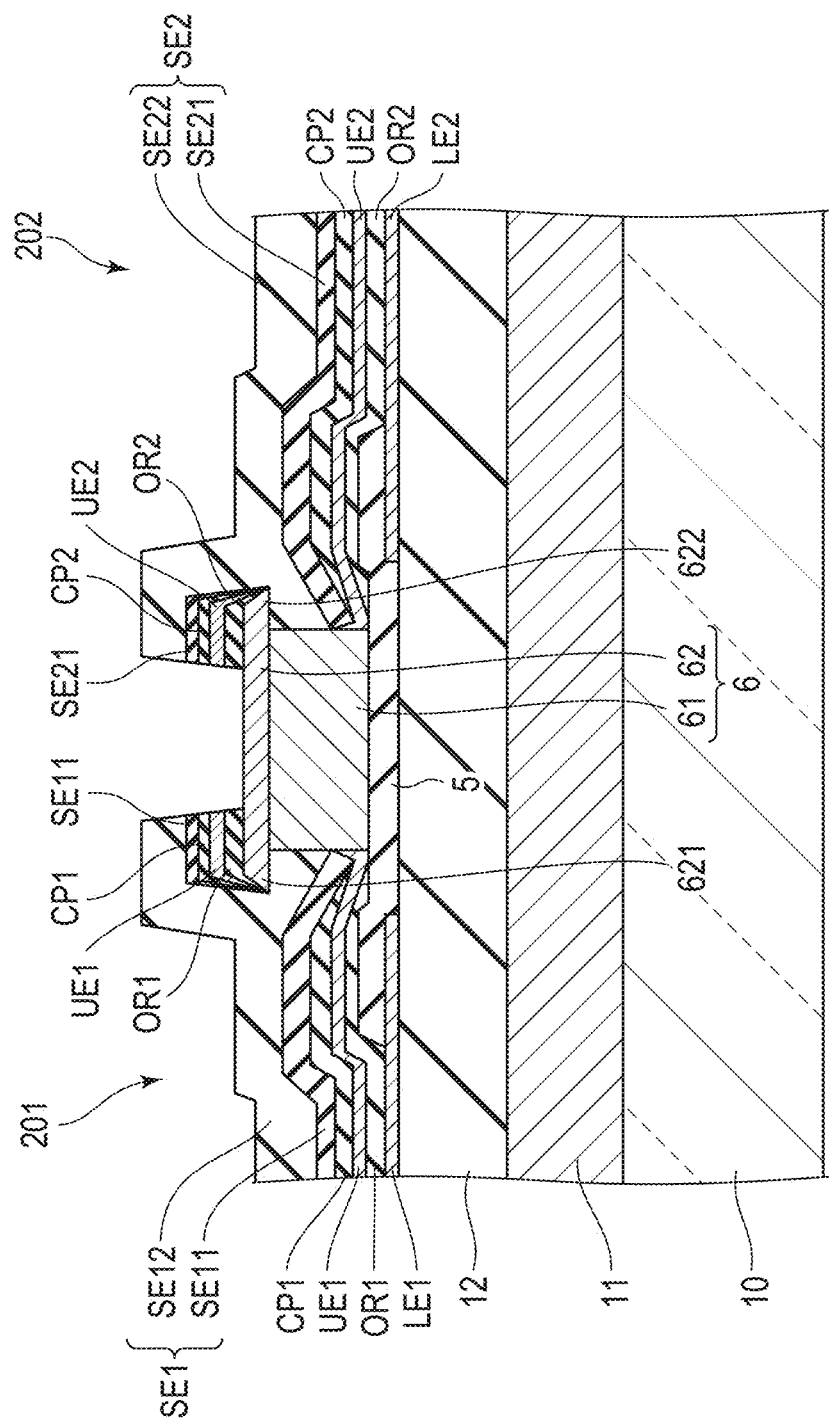
FIG. 5 is a cross-sectional view showing another configuration example of a sealing layer.

FIG. 5 is a cross-sectional view showing another configuration example of a sealing layer. Here, this specification explains a configuration example of the sealing layer SE1 with reference to a cross-sectional view in which the vicinity of the partition 6 between the display element 201 and the display element 202 is enlarged.

The configuration example shown in FIG. 5 is different from the configuration example shown in FIG. 4 in respect that the sealing layer SE1 which covers the display element 201 does not comprise the upper high-density layer. In other words, the sealing layer SE1 comprises the high-density layer SE11 and the low-density layer SE12.

The high-density layer SE11 overlaps the cap layer CP1 immediately above the lower electrode LE1. Further, the high-density layer SE11 overlaps the cap layer CP1 immediately above the partition 6. Of the high-density layer SE11, the portion provided on the upper portion 62 of the partition 6 is spaced apart from the portion located on the lower side relative to the upper portion 62.

The low-density layer SE12 covers the high-density layer SE11, is in contact with a side surface of the lower portion 61 of the partition 6, and fills the lower side of the protrusion 621.

As described above, each of the high-density layer SE11 and the low-density layer SE12 is formed of silicon nitride. However, each of them may be formed of silicon oxide, silicon oxynitride or aluminum oxide.

In a manner similar to that of the sealing layer SE1, the sealing layer SE2 which covers the display element 202 comprises the high-density layer SE21 and the low-density layer SE22 and does not comprise the upper high-density layer.

In the configuration example shown in FIG. 5, the high-density layer SE11 corresponds to the first high-density layer.

Figure 6:
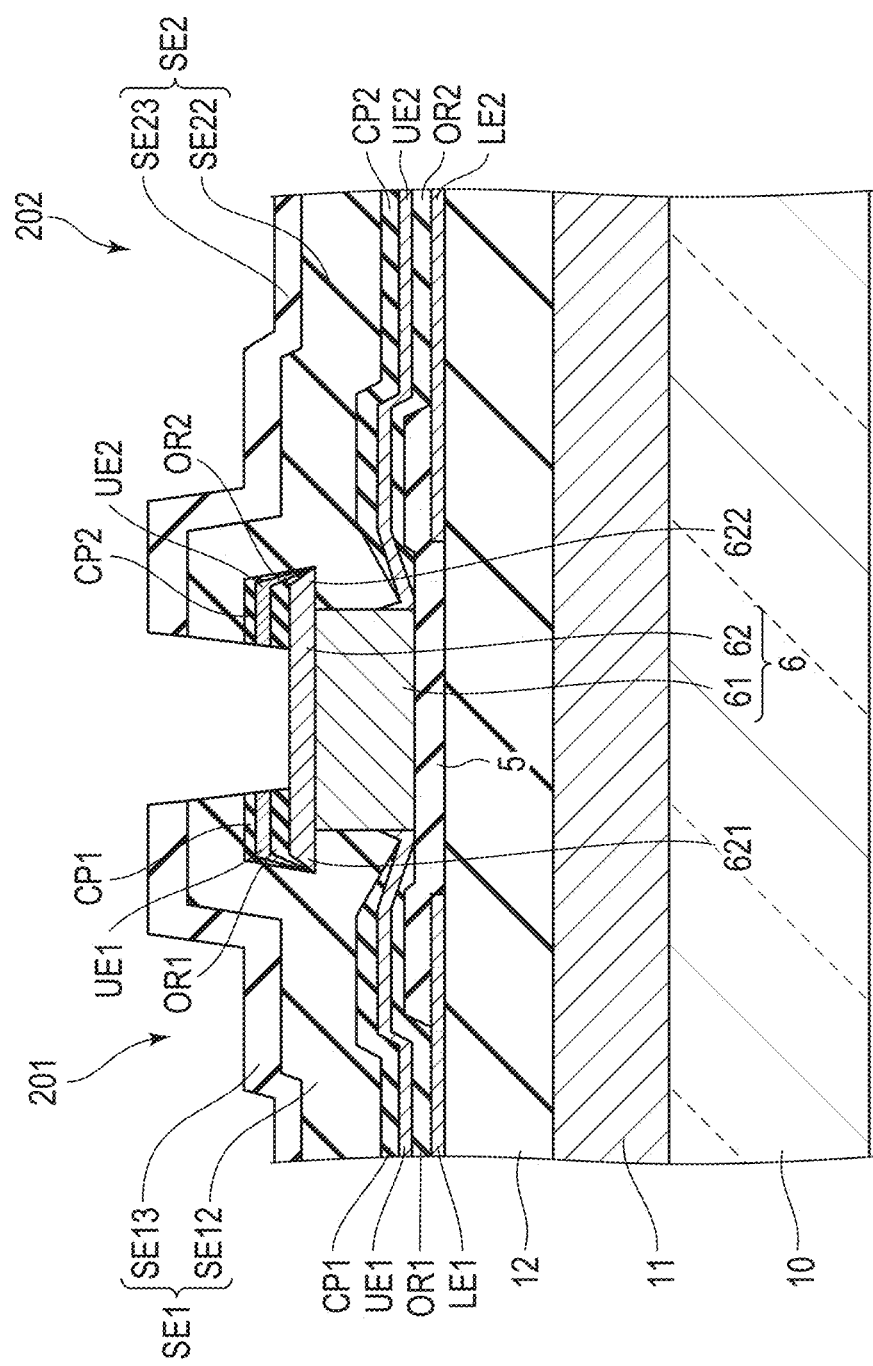
FIG. 6 is a cross-sectional view showing another configuration example of a sealing layer.

FIG. 6 is a cross-sectional view showing another configuration example of a sealing layer. Here, this specification explains a configuration example of the sealing layer SE1 with reference to a cross-sectional view in which the vicinity of the partition 6 between the display element 201 and the display element 202 is enlarged.

The configuration example shown in FIG. 6 is different from the configuration example shown in FIG. 4 in respect that the sealing layer SE1 which covers the display element 201 does not comprise the lower high-density layer. In other words, the sealing layer SE1 comprises the low-density layer SE12 and the high-density layer SE13.

The low-density layer SE12 covers the cap layer CP1 immediately above the lower electrode LE1 and immediately above the partition 6. The low-density layer SE12 is in contact with a side surface of the lower portion 61 of the partition 6 and fills the lower side of the protrusion 621.

The high-density layer SE13 covers the low-density layer SE12.

As described above, each of the high-density layer SE13 and the low-density layer SE12 is formed of silicon nitride. However, each of them may be formed of silicon oxide, silicon oxynitride or aluminum oxide.

In a manner similar to that of the sealing layer SE1, the sealing layer SE2 which covers the display element 202 comprises the high-density layer SE23 and the low-density layer SE22 and does not comprise the lower high-density layer.

In the configuration example shown in FIG. 6, the high-density layer SE13 corresponds to the first high-density layer.

As shown in FIG. 4 to FIG. 6, the sealing layer SE1 is a stacked layer body consisting of two or more layers and is configured to include the low-density layer SE12 which fills the lower side of the lower portion 61.

Now, this specification explains an example of the manufacturing method of the display device DSP.

Figure 7:
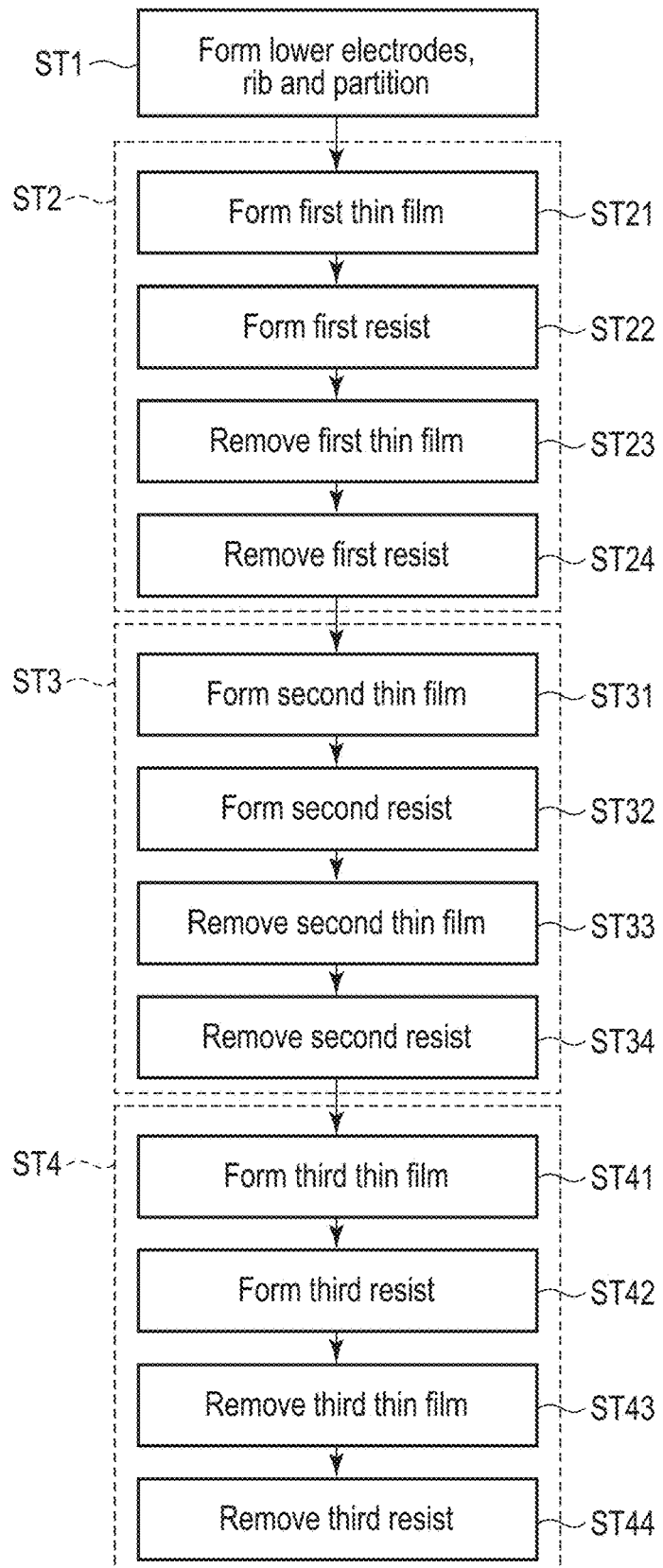
FIG. 7 is a flow diagram for explaining an example of the manufacturing method of the display device DSP.

FIG. 7 is a flow diagram for explaining an example of the manufacturing method of the display device DSP.

The manufacturing method shown here roughly includes the process of preparing a processing substrate SUB comprising subpixels SP1, SP2 and SP3 (step ST1), the process of forming the display element 201 of subpixel SP1 (step ST2), the process of forming the display element 202 of subpixel SP2 (step ST3) and the process of forming the display element 203 of subpixel SP3 (step ST4).

In step ST1, first, the processing substrate SUB is prepared by forming the lower electrode LE1 of subpixel SP1, the lower electrode LE2 of subpixel SP2, the lower electrode LE3 of subpixel SP3, the rib 5 and the partition 6 above the substrate 10. As shown in FIG. 3, the circuit layer 11 and the insulating layer 12 are also formed between the substrate 10 and the lower electrodes LE1, LE2 and LE3.

In step ST2, first, a first thin film 31 including the light emitting layer EM1 is formed over subpixel SP1, subpixel SP2 and subpixel SP3 (step ST21). The first thin film 31 is a stacked layer body of the organic layer OR1, upper electrode UE1, cap layer CP1 and sealing layer SE1 shown in FIG. 3. Subsequently, a first resist 41 patterned into a predetermined shape is formed on the first thin film 31 (step ST22). Subsequently, part of the first thin film 31 is removed by etching using the first resist 41 as a mask (step ST23). At this time, for example, the first thin film 31 provided in subpixel SP2 and subpixel SP3 is removed. Subsequently, the first resist 41 is removed (step ST24). In this way, subpixel SP1 is formed. Subpixel SP1 comprises the display element 201 comprising the first thin film 31 having a predetermined shape.

In step ST3, first, a second thin film 32 including the light emitting layer EM2 is formed over subpixel SP1, subpixel SP2 and subpixel SP3 (step ST31). The second thin film 32 is a stacked layer body of the organic layer OR2, upper electrode UE2, cap layer CP2 and sealing layer SE2 shown in FIG. 3. Subsequently, a second resist 42 patterned into a predetermined shape is formed on the second thin film 32 (step ST32). Subsequently, part of the second thin film 32 is removed by etching using the second resist 42 as a mask (step ST33). At this time, for example, the second thin film 32 provided in subpixel SP1 and subpixel SP3 is removed. Subsequently, the second resist 42 is removed (step ST34). In this way, subpixel SP2 is formed. Subpixel SP2 comprises the display element 202 comprising the second thin film 32 having a predetermined shape.

In step ST4, first, a third thin film 33 including the light emitting layer EM3 is formed over subpixel SP1, subpixel SP2 and subpixel SP3 (step ST41). The third thin film 33 is a stacked layer body of the organic layer OR3, upper electrode UE3, cap layer CP3 and sealing layer SE3 shown in FIG. 3. Subsequently, a third resist 43 patterned into a predetermined shape is formed on the third thin film 33 (step ST42). Subsequently, part of the third thin film 33 is removed by etching using the third resist 43 as a mask (step ST43). At this time, for example, the third thin film 33 provided in subpixel SP1 and subpixel SP2 is removed. Subsequently, the third resist 43 is removed (step ST44). In this way, subpixel SP3 is formed. Subpixel SP3 comprises the display element 203 comprising the third thin film 33 having a predetermined shape.

It should be noted that the detailed illustrations of the second thin film 32, the second resist 42, the third thin film 33 and the third resist 43 are omitted.

Now, this specification explains step ST1 and step ST2 with reference to FIG. 8 to FIG. 16. The section shown in each of FIG. 8 to FIG. 16 corresponds to, for example, the section taken along the A-B line of FIG. 2.

Figure 8:
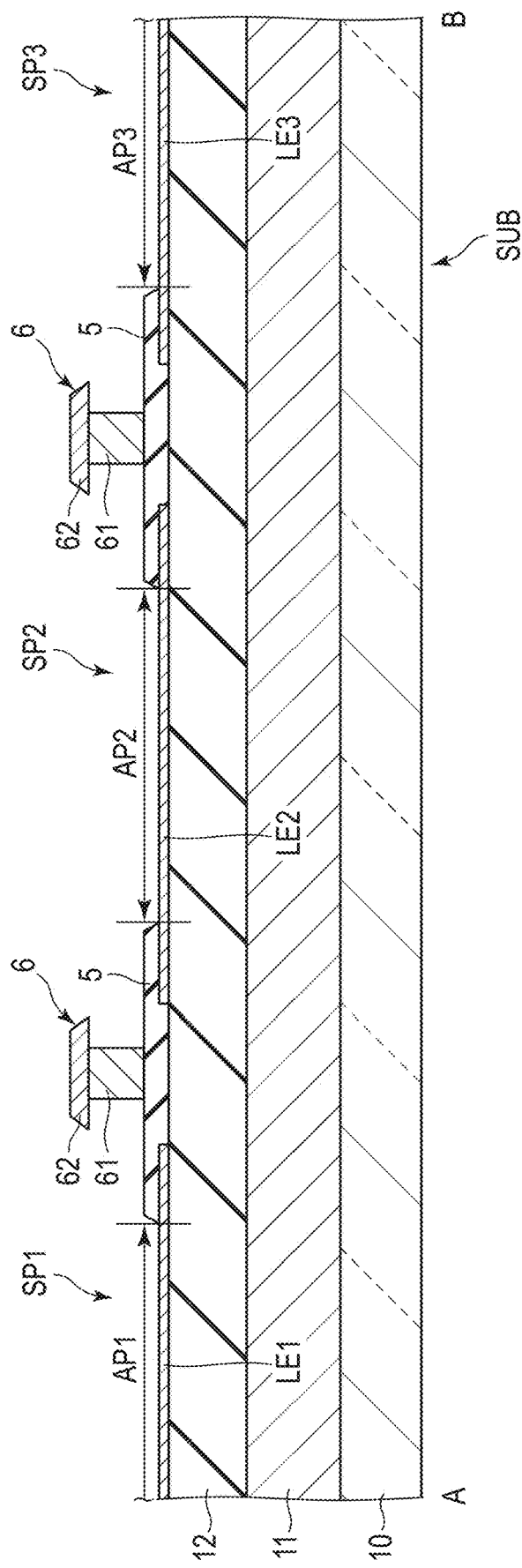
FIG. 8 is a diagram for explaining the manufacturing method of the display device DSP.

First, in step ST1, as shown in FIG. 8, the processing substrate SUB is prepared. The process of preparing the processing substrate SUB includes the process of forming the circuit layer 11 on the substrate 10, the process of forming the insulating layer 12 on the circuit layer 11, the process of forming the lower electrode LE1 of subpixel SP1, the lower electrode LE2 of subpixel SP2 and the lower electrode LE3 of subpixel SP3 on the insulating layer 12, the process of forming the rib 5 comprising the apertures AP1, AP2 and AP3 overlapping the lower electrodes LE1, LE2 and LE3, respectively, and the process of forming the partition 6 including the lower portion 61 provided on the rib 5 and the upper portion 62 provided on the lower portion 61 and protruding from the side surfaces of the lower portion 61. In each of FIG. 9 to FIG. 16, the illustrations of the substrate 10 and the circuit layer 11 lower than the insulating layer 12 are omitted.

The rib 5 is formed of, for example, silicon nitride.

Of the partition 6, at least the lower portion 61 is formed of a conductive material.

Subsequently, in step ST21, as shown in FIG. 9 to FIG. 12, the first thin film 31 is formed over subpixel SP1, subpixel SP2 and subpixel SP3. The process of forming the first thin film 31 includes, on the processing substrate SUB, the process of forming the organic layer OR1 including the light emitting layer EM1, the process of forming the upper electrode UE1 on the organic layer OR1, the process of forming the cap layer CP1 on the upper electrode UE1 and the process of forming the sealing layer SE1 on the cap layer CP1. The process of forming the sealing layer SE1 includes the process of forming the high-density layer SE11, the process of forming the low-density layer SE12 and the process of forming the high-density layer SE13.

Figure 9:
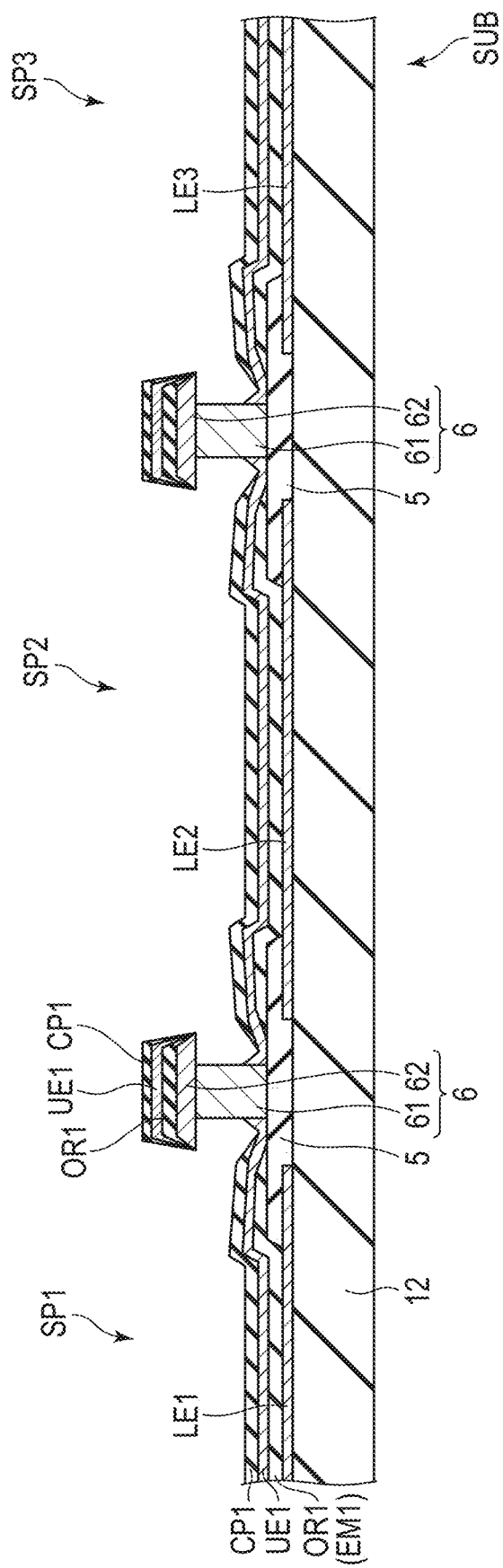
FIG. 9 is a diagram for explaining the manufacturing method of the display device DSP.

As shown in FIG. 9, the organic layer OR1 is formed on each of the lower electrode LE1, the lower electrode LE2 and the lower electrode LE3 and is also formed on the partition 6. Of the organic layer OR1, the portion formed on the upper portion 62 is spaced apart from the portion formed on each of the lower electrodes LE1, LE2 and LE3. The various functional layers and the light emitting layer EM1 of the organic layer OR1 are formed by a vapor deposition method.

The upper electrode UE1 is formed on the organic layer OR1 immediately above each of the lower electrodes LE1, LE2 and LE3, covers the rib 5 and is in contact with the lower portion 61 of the partition 6. The upper electrode UE1 is also formed on the organic layer OR1 immediately above the upper portion 62. Of the upper electrode UE1, the portion which is formed immediately above the upper portion 62 is spaced apart from the portion which is formed immediately above each of the lower electrodes LE1, LE2 and LE3. The upper electrode UE1 is formed of an alloy of magnesium and silver by a vapor deposition method.

The cap layer CP1 is formed on the upper electrode UE1 immediately above each of the lower electrode LE1, the lower electrode LE2 and the lower electrode LE3, and is also formed on the upper electrode UE1 immediately above the upper portion 62. Of the cap layer CP1, the portion which is formed immediately above the upper portion 62 is spaced apart from the portion which is formed immediately above each of the lower electrodes LE1, LE2 and LE3. The cap layer CP1 is formed by, for example, a vapor deposition method.

Subsequently, the sealing layer SE1 is formed.

Figure 10:
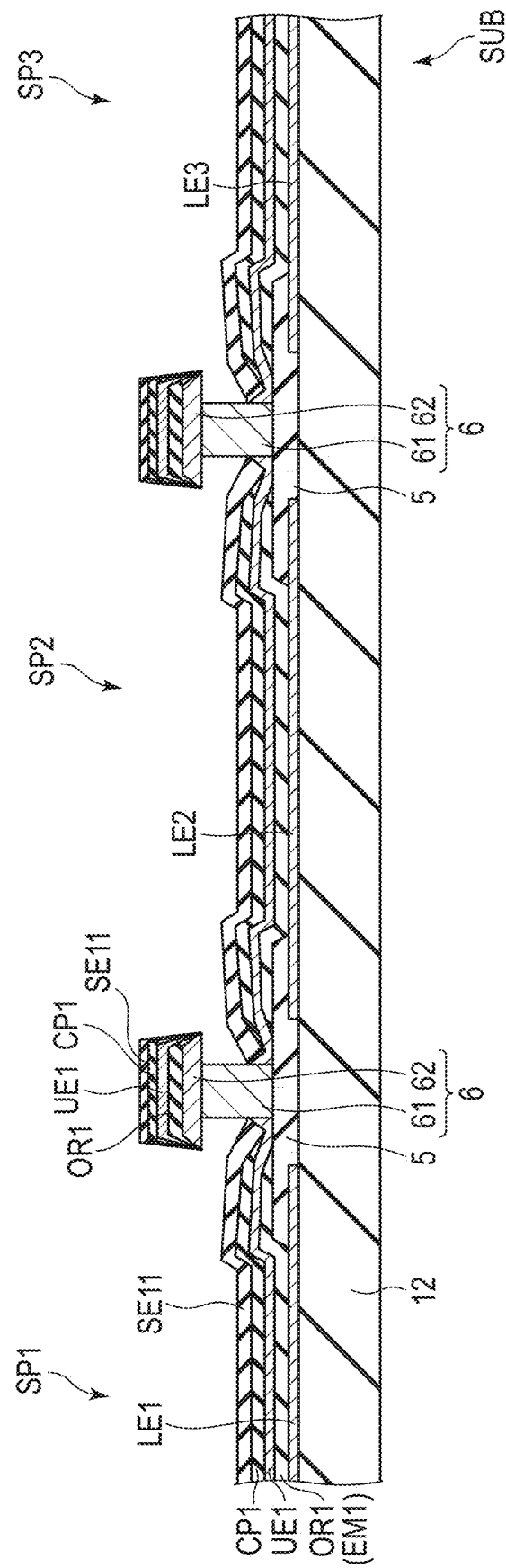
FIG. 10 is a diagram for explaining the manufacturing method of the display device DSP.

First, of the sealing layer SE1, the high-density layer SE11 is formed of an inorganic insulating material. As shown in FIG. 10, the high-density layer SE11 is formed on the cap layer CP1 immediately above each of the lower electrode LE1, the lower electrode LE2 and the lower electrode LE3, and is also formed on the cap layer CP1 immediately above the upper portion 62. Of the high-density layer SE11, the portion which is formed immediately above the upper portion 62 is spaced apart from the portion which is formed immediately above each of the lower electrodes LE1, LE2 and LE3.

The high-density layer SE11 is formed by, for example, a CVD method.

In other words, the processing substrate SUB in which the cap layer CP1 is formed is carried in a chamber. Subsequently, for example, a gas mixture of silicon hydride (SiH$_4$), ammonia (NH$_3$), nitrogen (N$_2$), hydrogen (H$_2$) and the like is introduced into the chamber through a gas intake port. Subsequently, a high-frequency power is applied to the gas intake port, and thus, silicon nitride is deposited as the high-density layer SE11 on the processing substrate SUB.

Figure 11:
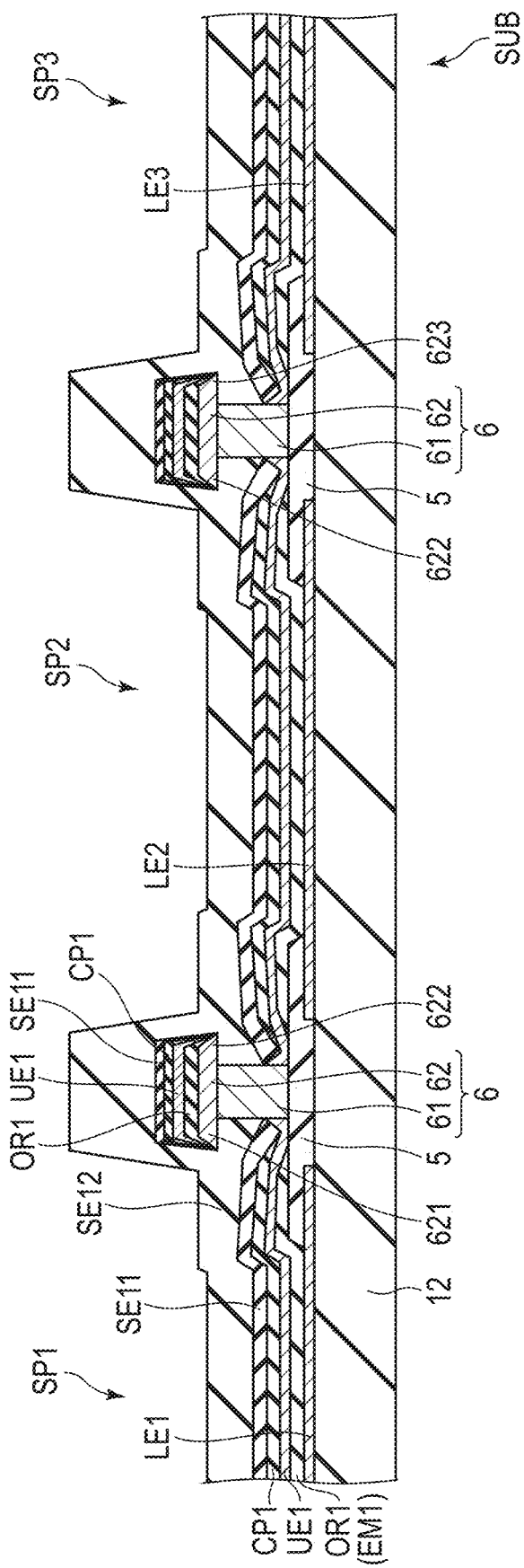
FIG. 11 is a diagram for explaining the manufacturing method of the display device DSP.

Subsequently, of the sealing layer SE1, the low-density layer SE12 is formed of an inorganic insulating material. As shown in FIG. 11, the low-density layer SE12 is formed so as to cover the high-density layer SE11 and the partition 6. In other words, the low-density layer SE12 is formed on the high-density layer SE11 immediately above each of the lower electrode LE1, the lower electrode LE2 and the lower electrode LE3, and is also formed on the high-density layer SE11 immediately above the upper portion 62. Further, the low-density layer SE12 is in contact with the lower portion 61 of the partition 6 and fills the portions located immediately under the protrusions 621 to 623. In the low-density layer SE12, the portion which is formed immediately above the upper portion 62 is continuous with the portion which is formed immediately above each of the lower electrodes.

For example, the low-density layer SE12 is formed by a CVD method in the same chamber which is used when the high-density layer SE11 is formed. It should be noted that various conditions such as the flow rate of the gas mixture to be introduced into the chamber, the ratio in the gas mixture and the high-frequency power to be applied are different from the conditions for forming the high-density layer SE11. For example, the ratio of hydrogen is adjusted so as to be higher than that of a case where the high-density layer SE11 is formed. By this configuration, silicon nitride is deposited as the low-density layer SE12 on the processing substrate SUB.

Figure 12:
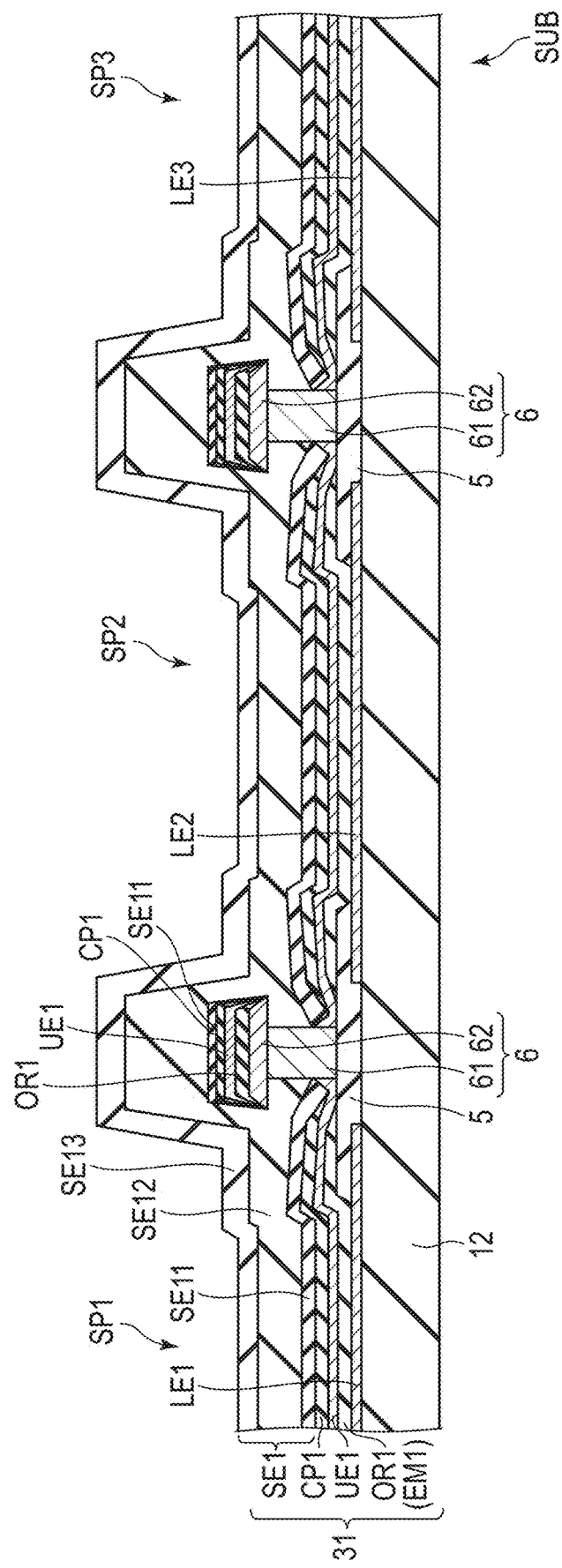
FIG. 12 is a diagram for explaining the manufacturing method of the display device DSP.

Subsequently, of the sealing layer SE1, the high-density layer SE13 is formed of an inorganic insulating material. As shown in FIG. 12, the high-density layer SE13 is formed so as to cover the low-density layer SE12. In other words, the high-density layer SE13 is formed on the low-density layer SE12 immediately above each of the lower electrode LE1, the lower electrode LE2 and the lower electrode LE3, and is also formed on the low-density layer SE12 immediately above the upper portion 62. Of the high-density layer SE13, the portion which is formed immediately above the upper portion 62 is continuous with the portion which is formed immediately above each of the lower electrodes LE1, LE2 and LE3.

For example, the high-density layer SE13 is formed by a CVD method in the same chamber which is used when the low-density layer SE12 is formed. The conditions for forming the high-density layer SE13 are, for example, the same as the conditions for forming the high-density layer SE11. By this process, silicon nitride is deposited as the high-density layer SE13 on the processing substrate SUB.

In this way, the first thin film 31 which is a stacked layer body consisting of the organic layer OR1, the upper electrode UE1, the cap layer CP1, the high-density layer SE11, the low-density layer SE12 and the high-density layer SE13 is formed.

Figure 13:
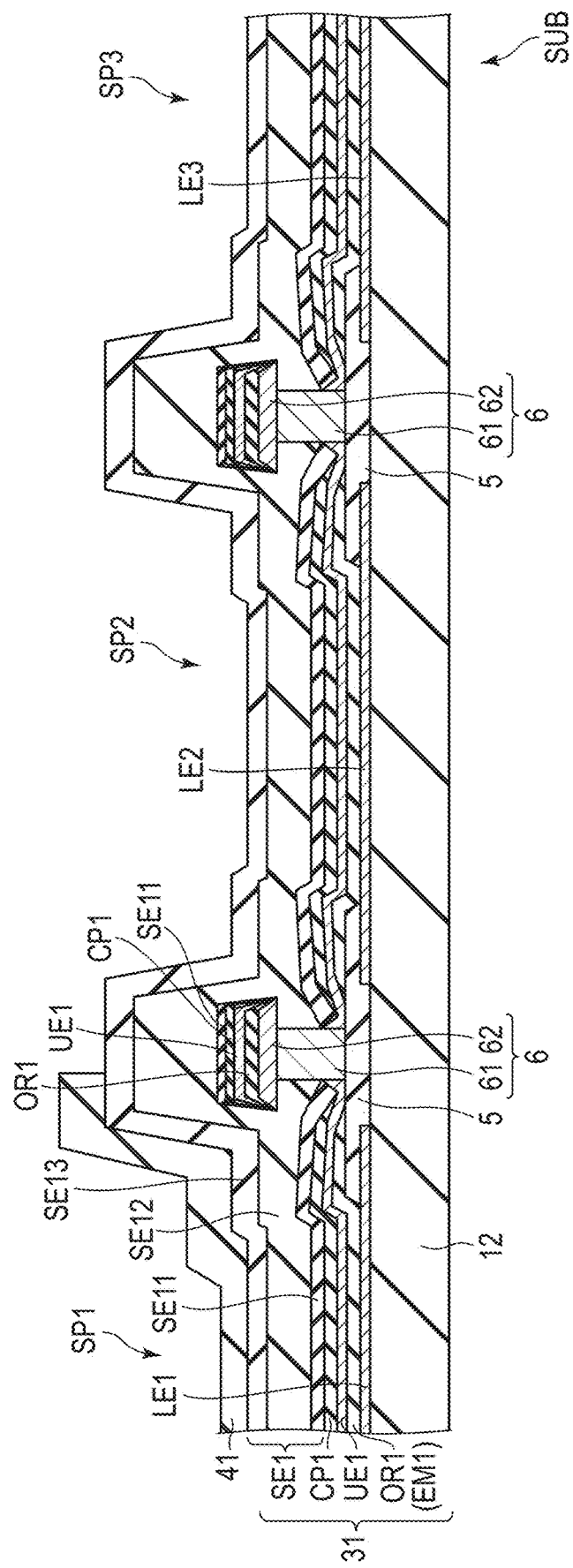
FIG. 13 is a diagram for explaining the manufacturing method of the display device DSP.

Subsequently, in step ST22, as shown in FIG. 13, the patterned first resist 41 is formed on the sealing layer SE1. The first resist 41 covers the first thin film 31 of subpixel SP1, and the first thin film 31 is exposed from the first resist 41 in subpixels SP2 and SP3. Thus, the first resist 41 overlaps the sealing layer SE1 located immediately above the lower electrode LE1. The first resist 41 extends from subpixel SP1 to the upper side of the partition 6. On the partition 6 between subpixel SP1 and subpixel SP2, the first resist 41 is provided on the subpixel SP1 side (the left side of the figure), and the sealing layer SE1 is exposed from the first resist 41 on the subpixel SP2 side (the right side of the figure). The sealing layer SE1 is exposed from the first resist 41 in subpixel SP2 and subpixel SP3.

Subsequently, in step ST23, etching is applied using the first resist 41 as a mask. By this process, the first thin film 31 exposed from the first resist 41 in subpixels SP2 and SP3 is removed, and the first thin film 31 remains in subpixel SP1.

The process of removing the first thin film 31 is, for example, as follows.

Figure 14:
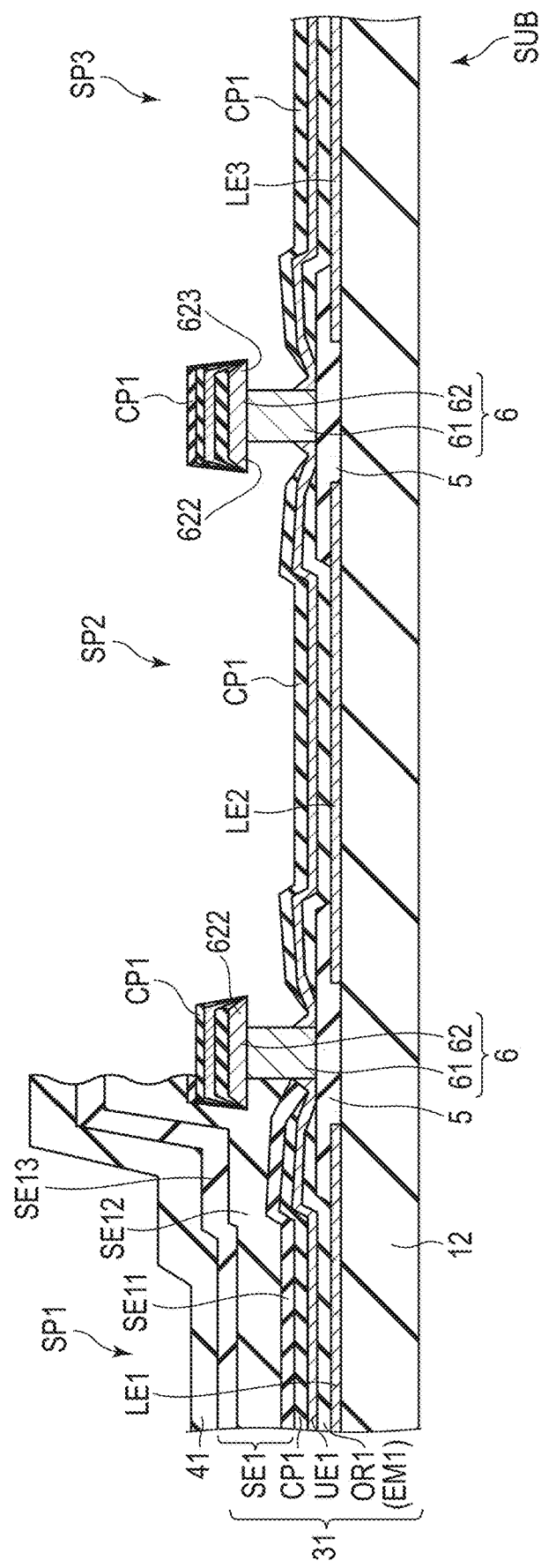
FIG. 14 is a diagram for explaining the manufacturing method of the display device DSP.

First, as shown in FIG. 14, dry etching is performed using the first resist 41 as a mask to remove the sealing layer SE1 exposed from the first resist 41. The sealing layer SE1 is also removed immediately under the protrusions 622 and 623. Regarding the dry etching of the sealing layer SE1, when the thickness of the layer which is removed per unit time is defined as an etching rate, the etching rate of the low-density layer SE12 is greater than that of the high-density layer SE11 and is greater than that of the high-density layer SE13.

As described above, the lower side of each protrusion of the partition is filled with the low-density layer SE12. Thus, the low-density layer SE12 is a thick layer compared to the high-density layers SE11 and SE13. To the contrary, the etching rate of the low-density layer SE12 is greater than the etching rates of the high-density layers SE11 and SE13. Thus, when dry etching is applied to the sealing layer SE1, a long processing time is not required. Further, compared to a case where the entire sealing layer SE1 is a high-density layer, the processing time can be shortened.

By applying etching to the sealing layer SE1 in this manner, the cap layer CP1 is partly exposed from the sealing layer SE1.

Figure 15:
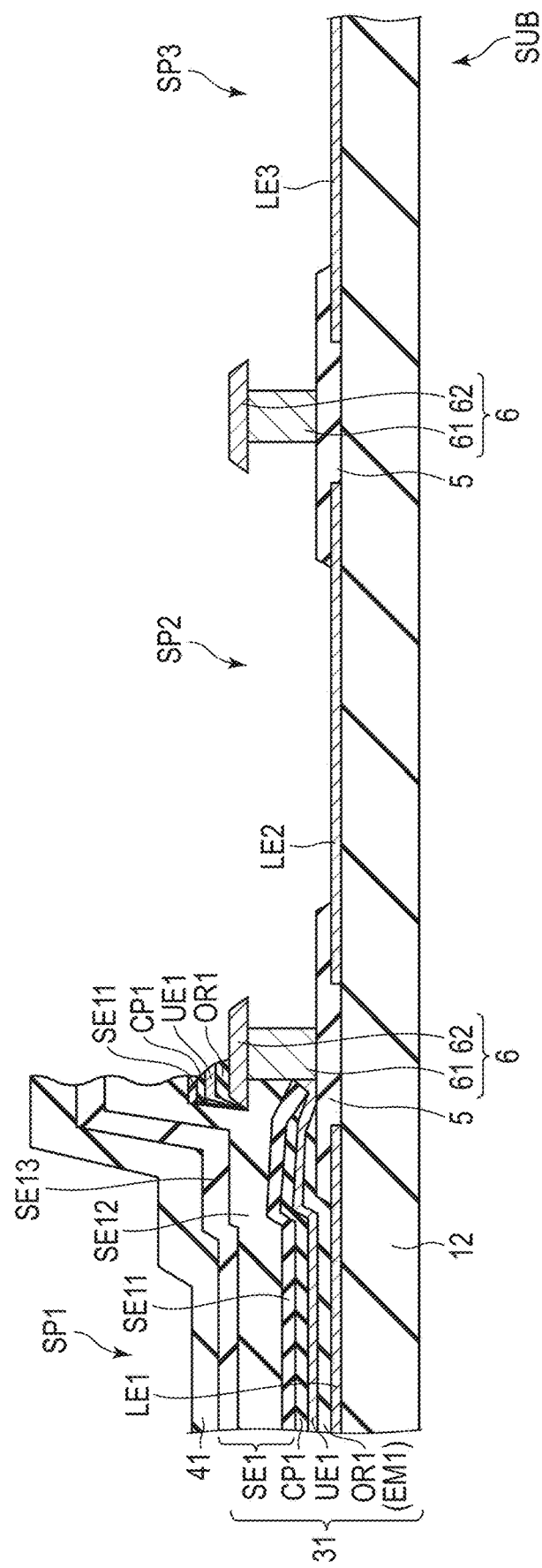
FIG. 15 is a diagram for explaining the manufacturing method of the display device DSP.

Subsequently, as shown in FIG. 15, etching is performed using the first resist 41 as a mask to remove the cap layer CP1 exposed from the sealing layer SE1.

Subsequently, wet etching is performed using the first resist 41 as a mask to remove the upper electrode UE1 exposed from the cap layer CP1.

Subsequently, dry etching is performed using the first resist 41 as a mask to remove the organic layer OR1 exposed from the upper electrode UE1.

In this way, the lower electrode LE2 is exposed in subpixel SP2, and the rib 5 surrounding the lower electrode LE2 is exposed. In subpixel SP3, the lower electrode LE3 is exposed, and the rib 5 surrounding the lower electrode LE3 is exposed. On the partition 6 between subpixel SP1 and subpixel SP2, the subpixel SP2 side is exposed. Further, the partition 6 between subpixel SP2 and subpixel SP3 is exposed.

Figure 16:
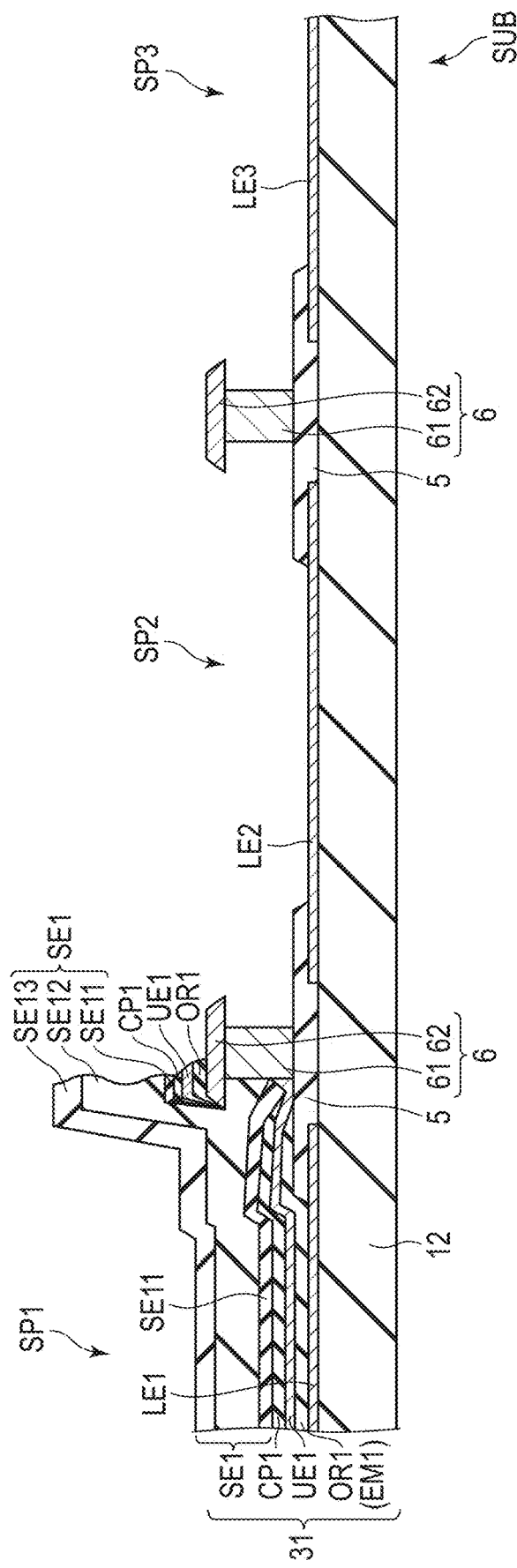
FIG. 16 is a diagram for explaining the manufacturing method of the display device DSP.

Subsequently, in step ST24, as shown in FIG. 16, the first resist 41 is removed. Thus, the sealing layer SE1 of subpixel SP1 is exposed. Through these steps ST21 to ST24, the display element 201 is formed in subpixel SP1. The display element 201 consists of the lower electrode LE1, the organic layer OR1 including the light emitting layer EM1, the upper electrode UE1 and the cap layer CP1. The display element 201 is covered with the sealing layer SE1.

A stacked layer body of the organic layer OR1 including the light emitting layer EM1, the upper electrode UE1, the cap layer CP1 and the sealing layer SE1 is formed on the partition 6 between subpixel SP1 and subpixel SP2. Of the partition 6, the portion on the subpixel SP1 side is covered with the sealing layer SE1. It should be noted that the stacked layer body on the partition 6 shown in FIG. 16 is completely removed in some cases.

Steps ST31 to ST34 shown in FIG. 7 are similar to steps ST21 to ST24 described above. Through these steps ST31 to ST34, the display element 202 is formed in subpixel SP2 shown in FIG. 3. The display element 202 consists of the lower electrode LE2, the organic layer OR2 including the light emitting layer EM2, the upper electrode UE2 and the cap layer CP2. The display element 202 is covered with the sealing layer SE2.

Steps ST41 to ST44 shown in FIG. 7 are also similar to steps ST21 to ST24 described above. Through these steps ST41 to ST44, the display element 203 is formed in subpixel SP3 shown in FIG. 3. The display element 203 consists of the lower electrode LE3, the organic layer OR3 including the light emitting layer EM3, the upper electrode UE3 and the cap layer CP3. The display element 203 is covered with the sealing layer SE3.

According to the present embodiment, the formation of a void is prevented without increasing the thickness of the sealing layer SE1, SE2 or SE3. This configuration prevents the generation of a crack based on a void, thereby preventing the moisture penetration through a void and the partial removal of the sealing layers in the manufacturing process of the display elements 201 to 203.

Further, each of the sealing layers SE1, SE2 and SE3 includes a high-density layer which mainly exerts a waterproof function and a low-density layer which fills the lower sides of the protrusions 621 to 623 of the partition 6. The high-density layer and the low-density layer can be successively formed only by changing the processing conditions in the same chamber.

The thickness of each of the sealing layers SE1, SE2 and SE3 is less than 3 µm, and is further less than 2 µm. This configuration prevents the reduction in the transmittance of the light emitted from the display elements 201 to 203 in the sealing layers SE1, SE2 and SE3, respectively.

The low-density layer is a layer which is thicker than the high-density layer. However, the transmittance of the low-density layer is higher than that of the high-density layer. Thus, compared to a case where the entire sealing layers are high-density layers, the reduction in transmittance is prevented.

The etching rate of the low-density layer is greater than that of the high-density layer. Thus, regarding the dry etching of the sealing layers SE1, SE2 and SE3, compared to a case where the entire sealing layers are high-density layers, the processing time required to remove the sealing layers can be shortened.

The manufacturing method described above discloses a method for forming the sealing layer SE1 shown in FIG. 4.

When the sealing layer SE1 shown in FIG. 5 is formed, the process of forming the high-density layer SE13 explained with reference to FIG. 12 is omitted. In this case, the first resist 41 shown in FIG. 13 is formed on the low-density layer SE12.

When the sealing layer SE1 shown in FIG. 6 is formed, the process of forming the high-density layer SE11 explained with reference to FIG. 10 is omitted.

In other words, the processing substrate SUB in which the cap layer CP1 is formed is carried in a chamber, and the low-density layer SE12 and the high-density layer SE13 are formed in series in the same chamber.

The low-density layer SE12 is formed on the cap layer CP1 immediately above each of the lower electrode LE1, the lower electrode LE2 and the lower electrode LE3, and is also formed on the cap layer CP1 immediately above the upper portion 62. Moreover, the low-density layer SE12 is in contact with the lower portion 61 of the partition 6. In the low-density layer SE12, the portion which is formed immediately above the upper portion 62 is continuous with the portion which is formed immediately above each of the lower electrodes.

The high-density layer SE13 is formed on the low-density layer SE12 immediately above each of the lower electrode LE1, the lower electrode LE2 and the lower electrode LE3, and is also formed on the low-density layer SE12 immediately above the upper portion 62. Of the high-density layer SE13, the portion which is formed immediately above the upper portion 62 is continuous with the portion which is formed immediately above each of the lower electrodes LE1, LE2 and LE3.

As explained above, the present embodiment can provide a display device which can prevent the reduction in reliability and have an improved manufacturing yield and a manufacturing method thereof.

All of the display devices and manufacturing methods thereof that can be implemented by a person of ordinary skill in the art through arbitrary design changes to the display device and manufacturing method thereof described above as each embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A manufacturing method of a display device, comprising:
   preparing a processing substrate by forming a lower electrode above a substrate, forming a rib comprising an aperture overlapping the lower electrode, and forming a partition including a lower portion located on the rib and an upper portion located on the lower portion and protruding from a side surface of the lower portion;
   forming an organic layer on the lower electrode in the aperture;
   forming an upper electrode on the organic layer;
   forming a cap layer on the upper electrode;
   forming a sealing layer on the cap layer;
   forming a patterned resist on the sealing layer; and
   removing the sealing layer exposed from the resist by dry etching, wherein
   the sealing layer includes:
      a first high-density layer formed of an inorganic insulating material; and
      a low-density layer which is stacked on the first high-density layer, has a density lower than the first high-density layer, and is formed of an inorganic insulating material, and
   when dry etching is applied to the sealing layer, an etching rate of the low-density layer is greater than an etching rate of the first high-density layer.

2. The manufacturing method of claim 1, wherein
   the forming the sealing layer includes:
      forming the first high-density layer immediately above the lower electrode and immediately above the partition; and
      forming the low-density layer which covers the first high-density layer and is in contact with the lower portion of the partition.

3. The manufacturing method of claim 1, wherein
   the forming the sealing layer includes:
      forming the low-density layer which covers the cap layer and is in contact with the lower portion of the partition; and
      forming the first high-density layer which covers the low-density layer.

4. The manufacturing method of claim 1, wherein
   the low-density layer and the first high-density layer are formed of silicon nitride.

5. The manufacturing method of claim 1, wherein
   the sealing layer further includes a second high-density layer having a density higher than the low-density layer and formed of an inorganic insulating material, and
   the forming the sealing layer includes:
      forming the first high-density layer immediately above the lower electrode and immediately above the partition;
      forming the low density-layer which covers the first high-density layer and is in contact with the lower portion of the partition; and
      forming a second high-density layer which covers the low-density layer.

6. The manufacturing method of claim 5, wherein
   the low-density layer, the first high-density layer and the second high-density layer are formed of silicon nitride.

7. The manufacturing method of claim 1, further comprising:
   after removing the sealing layer,
      removing the cap layer exposed from the sealing layer;
      removing the upper electrode exposed from the cap layer; and
      removing the organic layer exposed from the upper electrode.

8. A display device comprising:
   a substrate;
   a lower electrode provided above the substrate;
   a rib formed of an inorganic insulating material and comprising an aperture overlapping the lower electrode;
   a partition comprising a lower portion provided on the rib and formed of a conductive material, and an upper portion provided on the lower portion and protruding from a side surface of the lower portion;
   an organic layer provided on the lower electrode in the aperture;
   an upper electrode which is provided on the organic layer and is in contact with the lower portion of the partition;
   a cap layer provided on the upper electrode; and
   a sealing layer which covers the cap layer and is in contact with the lower portion of the partition, wherein
   the sealing layer includes:
      a first high-density layer formed of an inorganic insulating material; and
      a low-density layer which is stacked on the first high-density layer, has a density lower than the first high-density layer, and is formed of an inorganic insulating material.

9. The display device of claim 8, wherein
   the upper portion of the partition is partly exposed from the organic layer, the upper electrode, the cap layer and the sealing layer formed immediately above the partition, and
   the organic layer, the upper electrode, the cap layer and the sealing layer formed immediately above the partition are spaced apart from the organic layer, the upper electrode, the cap layer and the sealing layer formed immediately above the lower electrode.

10. The display device of claim 8, wherein
    in the sealing layer,
       the first high-density layer is formed immediately above the lower electrode and immediately above the partition, and
       the low-density layer covers the first high-density layer and is in contact with the lower portion of the partition.

11. The display device of claim 8, wherein
    in the sealing layer,
       the low-density layer covers the cap layer and is in contact with the lower portion of the partition, and
       the first high-density layer covers the low-density layer.

12. The display device of claim 8, wherein
    the low-density layer and the first high-density layer are formed of silicon nitride.

13. The display device of claim 8, wherein
the sealing layer further includes a second high-density layer having a density higher than the low-density layer and formed of an inorganic insulating material, and
in the sealing layer,
- the first high-density layer is formed immediately above the lower electrode and immediately above the partition,
- the low-density layer covers the first high-density layer and is in contact with the lower portion of the partition, and
- the second high-density layer covers the low-density layer.

14. The display device of claim 13, wherein
the low-density layer, the first high-density layer and the second high-density layer are formed of silicon nitride.

15. The display device of claim 13, wherein
a thickness of the low-density layer is greater than a thickness of the first high-density layer, and is greater than a thickness of the second high-density layer.

16. The display device of claim 15, wherein
the thickness of the low-density layer is greater than or equal to 0.6 times a thickness of the lower portion of the partition but less than or equal to 0.8 times the thickness of the lower portion of the partition.

17. The display device of claim 16, wherein
a sum of the thickness of the first high-density layer and the thickness of the second high-density layer is greater than or equal to 800 nm but less than or equal to 1000 nm.

* * * * *